(12) United States Patent
Nakajo et al.

(10) Patent No.: US 8,936,950 B2
(45) Date of Patent: Jan. 20, 2015

(54) METHOD FOR MANUFACTURING SEMICONDUCTOR LIGHT-EMITTING DEVICE

(75) Inventors: Naoki Nakajo, Kiyosu (JP); Masao Kamiya, Kiyosu (JP); Akihiro Honma, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 40 days.

(21) Appl. No.: 13/636,392

(22) PCT Filed: Mar. 14, 2011

(86) PCT No.: PCT/JP2011/001472
§ 371 (c)(1),
(2), (4) Date: Sep. 21, 2012

(87) PCT Pub. No.: WO2011/118149
PCT Pub. Date: Sep. 29, 2011

(65) Prior Publication Data
US 2013/0011953 A1 Jan. 10, 2013

(30) Foreign Application Priority Data
Mar. 23, 2010 (JP) .................. 2010-066087

(51) Int. Cl.
| | | |
|---|---|---|
| H01L 21/00 | (2006.01) | |
| H01L 33/42 | (2010.01) | |
| H01L 33/44 | (2010.01) | |
| H01L 33/46 | (2010.01) | |
| H01L 33/00 | (2010.01) | |

(52) U.S. Cl.
CPC .............. *H01L 33/42* (2013.01); *H01L 33/44* (2013.01); *H01L 33/46* (2013.01); *H01L 33/0095* (2013.01)
USPC .................. 438/22; 438/31; 438/40; 257/91; 257/99; 257/E33.064; 257/E33.065

(58) Field of Classification Search
USPC ............ 438/22, 28, 31, 40; 257/91, 99; 257/E33.064, E33.065
See application file for complete search history.

(56) References Cited

U.S. PATENT DOCUMENTS

| 6,893,889 B2 | 5/2005 | Park et al. |
|---|---|---|
| 7,366,218 B2 | 4/2008 | Mukoyama et al. |

(Continued)

FOREIGN PATENT DOCUMENTS

| JP | 07-130701 | * | 5/1995 |
|---|---|---|---|
| JP | 7-130701 A | | 5/1995 |

(Continued)

OTHER PUBLICATIONS

International Search Report (ISR) (PCT Form PCT/ISA/210) dated Apr. 26, 2011, in PCT/JP2011/001472.

(Continued)

*Primary Examiner* — Su Kim
(74) *Attorney, Agent, or Firm* — McGinn IP Law Group, PLLC (57) ABSTRACT

To improve light emission efficiency and reliability.
A transparent conductive film 10 is formed on an entire top surface of a second semiconductor layer 108, and a photo-resist is applied thereon. When removing the photo-resist on the upper surface corresponding to an electrode forming part 16 of a first semiconductor layer 104, the photo-resist is removed to be gradually thinned at a boundary of a portion to be removed. The transparent conductive film is wet etched using the remaining photo-resist as a mask to expose a part of the second semiconductor layer. Dry etching is performed using the remaining photo-resist and the transparent conductive film as a mask to expose the electrode forming part of the first semiconductor layer. A portion of the transparent conductive film exposed in the dry etching using the remaining photo-resist as a mask is wet etched. The remaining photo-resist is eliminated.

20 Claims, 5 Drawing Sheets

(56) References Cited

U.S. PATENT DOCUMENTS

2006/0199289 A1* 9/2006 Shei et al. ............... 438/21
2009/0290355 A1* 11/2009 Kim et al. ................ 362/307

FOREIGN PATENT DOCUMENTS

| | | |
|---|---|---|
| JP | 10-173229 A | 6/1998 |
| JP | 2001-185758 A | 7/2001 |
| JP | 2005-19945 A | 1/2005 |
| JP | 2005-268725 A | 9/2005 |
| JP | 2006-49829 A | 2/2006 |
| JP | 2006-339384 A | 12/2006 |

OTHER PUBLICATIONS

Chinese Office Action dated Aug. 20, 2014 and English Translation thereof.

* cited by examiner

METHOD FOR MANUFACTURING SEMICONDUCTOR LIGHT-EMITTING DEVICE

TECHNICAL FIELD

The present invention relates to a method for producing a semiconductor light-emitting device having an n-electrode and a p-electrode made of transparent conductive film on a same side, and particularly to a Group III nitride semiconductor light-emitting device.

BACKGROUND ART

For example, in the conventional Group III nitride semiconductor light-emitting device, even when a p-type layer is subjected to a treatment for reducing a resistivity, the p-type layer is higher in resistivity than an n-type layer. Therefore, light emits only right under the electrode because the current does not substantially diffuse in a lateral direction on a plane within the p-type layer. Thus, it is necessary that an electrode layer must be formed over a wide range on the upper surface of the p-type layer. Also, it is necessary that an electrode for the n-type layer as a lower layer is formed on the upper surface of the device because an insulating material such as sapphire is used as a substrate. In order to achieve this, there was a need to remove the p-type layer, the light-emitting layer and so on existing above the n-type layer by etching to expose a portion of the n-type layer being an n-electrode forming part, to form the electrode on the upper surface of the exposed n-type layer, and to form a transparent electrode on the upper surface of the p-type layer.

As described above, the exposure process of the n-type layer, the formation process of the n-electrode on the n-type layer, the formation process of a transparent electrode on the p-type layer, a plurality of photolisography processes and the etching process were required. Since the transparent electrode is formed on the p-type layer after the exposure process of the n-type layer, it is difficult to form a mask having windows formed on an entire top surface of the p-type layer, with accurate positioning at a boundary between the exposed n-type layer and the p-type layer. Accordingly, the transparent electrode had to be formed on the p-type layer about a few μm back from the above boundary (i.e., the edge of the step). Thus, there is a portion of the p-type layer on which the transparent electrode is not formed, that is, there is a portion that does not contribute to light emission, resulting in a reduction of light emission efficiency.

To solve this problem, the technologies disclosed in the following Patent Documents 1 and 2 are available. In the technology of Patent Document 1, after a transparent electrode made of metal and a $SiO_2$ layer are formed on an entire top surface of a p-type layer, a photo-resist is applied on an entire top surface of the $SiO_2$ layer. A portion, which corresponds to a portion to expose the n-type layer, of the $SiO_2$ layer is wet etched by photolisography. Semiconductor layers such as a p-type layer are dry etched using the remaining photo-resist and the $SiO_2$ layer as a mask, to expose the portion of the n-type layer, and the $SiO_2$ layer is removed by wet etching. This process can improve light emission efficiency because the transparent electrode is formed up to a boundary between the exposed n-type layer and p-type layer as well as the total number of processes is reduced. However, conductive atoms such as metal are adhered to a pn junction on the sidewall of the step in the process for exposing the n-type layer, and thus the reliability of the device was reduced.

On the other hand, the technology disclosed in the Patent Document 2 uses ITO as a transparent electrode on a p-type layer. In this technology, after an ITO transparent electrode is formed on an entire top surface of the p-type layer, a photo-resist is applied thereon, and a portion, which corresponds to a portion to expose the n-type layer, of the ITO film is wet etched by photolisography. Semiconductor layers such as p-type layer are dry etched using the remaining photo-resist and the ITO film as mask, to expose the portion of the n-type layer. Moreover, when an electric field is applied to the p-type layer edge of the etched step, electrostatic break down voltage is reduced. To prevent the electric field from being applied to the p-type layer edge, an ITO film is formed in a position of about 3 μm backward from the p-type layer edge. Therefore, when the ITO film is wet etched using a mask, the ITO film is undercut etched from the mask edge to the position backward from the mask edge. This makes the ITO film edge position in a position backward from the edge of the p-type layer so that an electric field is not applied to the p-type layer edge of the step.

PRIOR ART DOCUMENTS

Patent Documents

Patent Document 1: Japanese Patent Application Laid-Open (kokai) No. 1998-173229
Patent Document 2: Japanese Patent Application Laid-Open (kokai) No. 2005-19945

SUMMARY OF INVENTION

Problems to be Solved by the Invention

In the above-mentioned method, the wet etching time must be accurately controlled to undercut etch only a specified amount of ITO film just under the edge of the photo-resist. When the undercut amount is small, it causes the reduction of electrostatic break down voltage. When the undercut amount is large, a region of the p-type layer on which the ITO film is not formed, is increased, resulting in a reduction of light emission efficiency.

Moreover, when the semiconductor layers such as the p-type layer are dry etched with reactive gas plasma using the ITO film and the photo-resist thereon as a mask to expose the portion of the n-type layer, conductive metal atoms such as In or Sn constituting the ITO film, are adhered to the sidewall of the pn junction, causing a leakage current.

In view of the foregoing, an object of the present invention is to simplify the production process, and improve the light emission efficiency and the reliability of the light-emitting device having a transparent conductive film as an electrode.

Means for Solving the Problems

In a first aspect of the present invention, there is provided a method for producing a semiconductor light-emitting device comprising a substrate; a first semiconductor layer with a first conduction type formed on the substrate; a second semiconductor layer with a second conduction type different from the first conduction type; a second electrode made of a transparent conductive film formed on the second semiconductor layer; and a first electrode formed on an electrode forming part of the first semiconductor layer which is exposed by etching from the second semiconductor layer, characterized in that the method comprises: forming the transparent conductive film on an entire top surface of the second semiconductor layer; applying a photo-resist on the transparent conductive film; removing a portion, which exists right above the electrode forming part of the first semiconductor layer, of the photo-resist so that a remaining portion of the photo-resist is gradually thinned toward the portion to be removed at a boundary of the portion to be removed; exposing a portion of the second semiconductor layer by wet etching the transparent conductive film using the remaining photo-resist; exposing the electrode forming part of the first semiconductor layer by dry etching using the photo-resist and the transparent conductive film as a mask; wet etching a portion, which is exposed in the dry etching, of the transparent conductive film using the remaining photo-resist as a mask; eliminating the remaining photo-resist.

Here, the light-emitting device can be used in a face-up wire bonding type light-emitting device that outputs a light to the outside through a transparent conductive film. Moreover, the light-emitting device may be a flip-chip type which is used in the so called face-down type in which a transparent substrate is held with the device surface downwardly and a semiconductor layer side is connected to a lead frame. In the case of the flip-chip type, the present invention can be used in the device in which a reflector is formed directly or via an insulating film on the transparent conductive film. Although any semiconductor material may be used, the present invention is effective particularly when a Group III nitride semiconductor is used for layers. The second semiconductor layer on which the transparent conductive film is formed may be a p-type semiconductor or n-type semiconductor. However, a p-type semiconductor having a higher specific resistivity than that of an n-type semiconductor is generally used as a semiconductor on which the transparent conductive film is formed. Therefore, in the present invention, generally, the first conduction type is n-type, the second conduction type is p-type, the first semiconductor layer is an n-type semiconductor layer, and the second semiconductor layer is a p-type semiconductor layer. However, for the following reasons, it is also possible that the first conduction type is p-type, the second conduction type is n-type, the first semiconductor layer is a p-type semiconductor layer, and the second semiconductor layer is an n-type semiconductor layer.

When the uppermost layer farthest from a substrate is a Group III nitride semiconductor, that layer is usually a p-type semiconductor so that a p-type-activation treatment may be possible. However, the uppermost layer may be an n-type semiconductor by the advanced manufacturing technology, or the uppermost layer farthest from the base substrate is an n-type semiconductor in the light-emitting device manufactured by a laser lift off (LLO) method. The present invention can be applied to when the second semiconductor layer on which the transparent conductive film is formed is of any conduction type.

A photo-resist can be formed such that when removing the portion, which exists right above the electrode forming part of the first semiconductor layer, of the photo-resist, the remaining portion of the photo-resist is thinned toward the portion to be removed at the boundary of the portion to be removed, by adjusting the exposure intensity distribution of the photo-resist to control the thickness of the photo-resist after development. For example, when the exposed part of the photo-resist is removed when developing, such photo-resist formation can be achieved by gradually decreasing the exposure intensity toward the remaining portion at the boundary between the portion to be removed and the remaining portion. The remaining photo-resist is gradually thinned toward the portion removed, and an inclined surface (hereinafter referred to as "inclined portion") is formed at the boundary.

As the semiconductor layer, a Group III nitride semiconductor can be used. As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 3B or Group 13 element (e.g., B or Tl), or a portion of N is substituted by another Group 5B or Group 15 element (e.g., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

Effects of the Invention

A transparent conductive film is formed on an entire top surface of a second semiconductor layer, a photo-resist is applied thereon. Thereafter, the photo-resist of a portion corresponding to an electrode forming part of a first semiconductor layer is removed by photolisography. A portion of the transparent conductive film is wet etched using the remaining photo-resist as a mask. Then, dry etching is performed to expose the first semiconductor layer using the transparent conductive film and the photo-resist as a mask. Therefore, the process for exposing the first semiconductor layer and the process for patterning the transparent conductive film on the second semiconductor layer can be performed by one photolisography process, thus the production process is simplified.

Since it is not necessary to form the transparent conductive film after the electrode forming part of the first semiconductor layer is formed, no positioning is required when forming a mask, and the production is simplified. Since the transparent conductive film can be formed on the entire top surface of the second semiconductor layer, light emission efficiency can be improved. Moreover, since the transparent conductive film is formed on the entire top surface of the second semiconductor layer, the cross-section area of the current path is increased, thus the driving voltage as well as the resistance can be reduced. The photo-resist has the inclined portion that is gradually thinned at the boundary between the portion removed and the remaining portion. A specified thin portion of the inclined portion is etched and disappears in the dry etching process to expose the first semiconductor layer. A portion of the transparent conductive film is exposed at the portion where the photo-resist is removed. Since the transparent conductive film has durability against dry etching higher than that of the semiconductor layer, it is difficult to be etched. Even if the exposed portion of the transparent conductive film is etched, since the inclined portion of the photo-resist existed on the exposed surface of the transparent conductive film before etching, etching start is delayed. As a result, the exposed portion of the transparent conductive film is not completely etched. The thicknesses of the photo-resist and the transparent conductive film are determined so that the condition is realized. After dry etching, the exposed portion of the transparent conductive film is wet etched using the remaining photo-resist as a mask, in other words, a portion corresponding to the specified thin portion of the inclined portion of the photo-resist is etched. As a result, the edge of the transparent conductive film is backward by the specified portion of the inclined portion from the boundary of the electrode forming part of the first semiconductor layer. Since this backward position can be adjusted by the width or angle of the inclined portion of the photo-resist, the backward amount can be very small with great accuracy. Therefore, the transparent conductive film can be formed on almost the entire top surface of the second semiconductor layer, and thus light emission efficiency of the light-emitting device can be improved.

Moreover, since there is the process for wet etching the transparent conductive film after dry etching for exposing the first semiconductor layer, the conductive metal atmos if any adhered to the pn junction on the sidewall of the step formed in the dry etching process, can be removed in this wet etching process. Accordingly, the reliability of the device is improved.

MODE FOR CARRYING OUT THE INVENTION

The specific embodiments for carrying out the present invention are described below.

Any substrate may be used, such as insulating substrate, conductive substrate, opaque substrate, or transparent substrate. For example, sapphire ($Al_2O_3$), silicon carbide (SiC), gallium nitride (GaN), gallium phosphoide (GaP), zinc oxide (ZnO), magnesium oxide (MgO), manganese oxide (MnO) or a quaternary, ternary, or binary semiconductor represented by a formula $Al_xGa_yIn_{1-x-y}N$, or AlN or ceramics can be employed as a substrate.

Examples of the transparent conductive film include electrically conductive oxide film such as metal oxides. Representatively, indium tin oxide (ITO) or zinc oxide (ZnO) may be used. Besides, transparent conductive films made of a material (AZO or GZO) which is ZnO added with several percent of an element which will become a trivalent ion as in $Al_2O_3$ or $Ga_2O_3$, fluorine-doped zinc oxide (FZO), a complex of indium oxide and zinc oxide, niobium-added titanium dioxide $Ti_{1-x}Nb_xO_2$ (TNO), or other materials such as zinc oxide based materials, indium oxide based materials, tin oxide based materials, and cadmium based materials (CTO) can be used. These materials are easily wet etched, and the etching rates of these materials are slower than the etching rate of Group III nitride semiconductor in dry etching using chlorine or fluorine. Any material may be used for wet etching as long as a transparent conductive film can be etched. Any material may be used for dry etching as long as a Group III nitride semiconductor can be etched. Plasma etching using chlorine or fluorine can be used. Although the first and second electrodes may be made of any material, for example, nickel (Ni), titanium (Ti), gold (Au), a multilayered film of gold and titanium, or a multilayered film comprising at least one of gold and titanium alloy, tungsten (W), titanium (Ti), and gold (Au) can be used.

The transparent conductive film can be formed by sputtering or vacuum vapor deposition. It is not limited to this, but electron beam vacuum vapor deposition is preferable. Preferably, a single quantum well (SQW) structure or a multiple quantum well (MQW) structure constituting the light-emitting layer comprises a well layer made of a Group III nitride based compound semiconductor containing at least indium (In), which is represented by $Al_yGa_{1-y-z}In_zN$ ($0 \leq y < 1$, $0 < z \leq 1$). Examples of the constitution of the light-emitting layer comprises a well layer made of doped or undoped $Ga_{1-z}In_zN$ ($0 < z \leq 1$) and a barrier layer made of a Group III nitride based compound semiconductor represented by AlGaInN with an arbitrary compositional proportion the ban gap of which is larger than that of the well layer. Preferred examples thereof include a well layer made of undoped $Ga_{1-z}In_zN$ ($0 < z \leq 1$) and a barrier layer made of undoped GaN. Here, the term "doped" means that a dopant is intentionally mixed into a raw material gas and added to the objective layer; and the term "undoped" means that the dopant is not intentionally mixed into the raw material gas and not added to the objective layer. In consequence, the term "undoped" also includes the case where the doping is spontaneously made through diffusion from the near layer.

Molecular beam epitaxy (MBE), metal-organic vapor phase epitaxy (MOVPE), hydryde vapor phase epitaxy (HVPE), liquid phase epitaxy and so on are effective for a crystal growth of the Group III nitride semiconductor layer. The Group III-V nitride semiconductor of each of the layers constituting the semiconductor light-emitting device can be formed of a Group III-V nitride based compound semiconductor composed of a binary system, ternary system or quaternary system semiconductor which is at least represented by a formula $Al_xGa_yInN$ ($0 \leq x \leq 1$, $0 \leq y \leq 1$, $0 \leq x+y \leq 1$). Also, a part of such a Group III element (Al, Ga, or In) may be substituted with boron (B) or thallium (Tl), and a part of nitrogen (N) may be substituted with phosphorus (P), arsenic (As), antimony (Sb) or bismuth (Bi).

Furthermore, in the case of forming an n-type layer using such a semiconductor, Si, Ge, Se, Te, C or the like can be added as n-type impurities, and in the case of forming a p-type layer using such a semiconductor, Mg, Be, Ca, Sr, Ba or the like can be added as p-type impurities.

Embodiment 1

Figure 1:
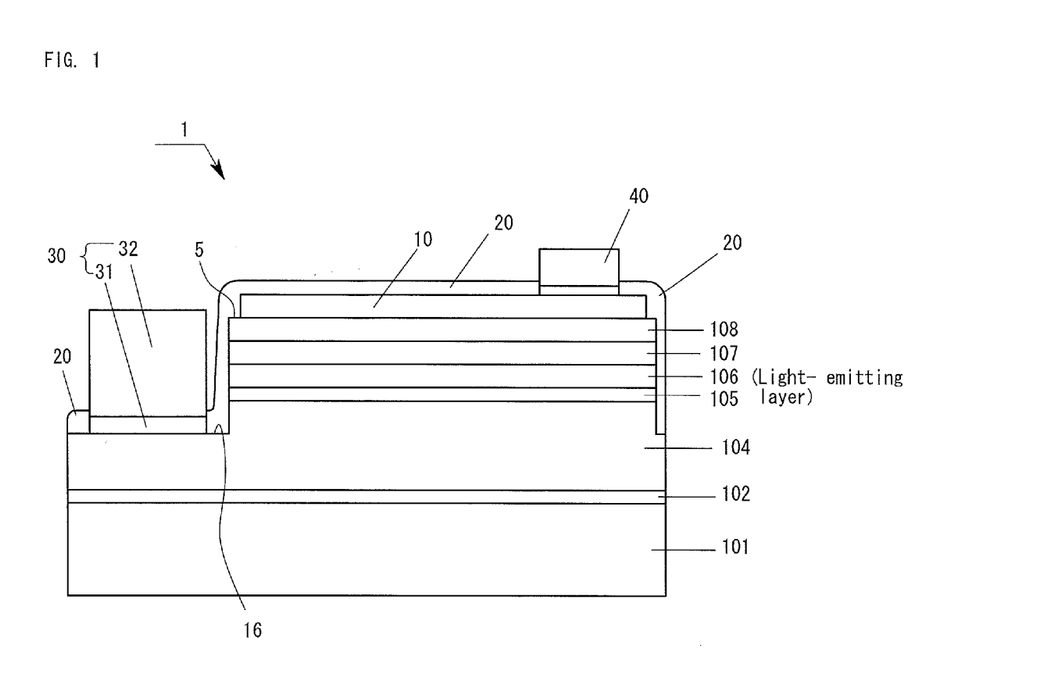
[FIG. 1] A cross-sectional view of a light-emitting device according to a specific embodiment of the present invention.
Figure 2:
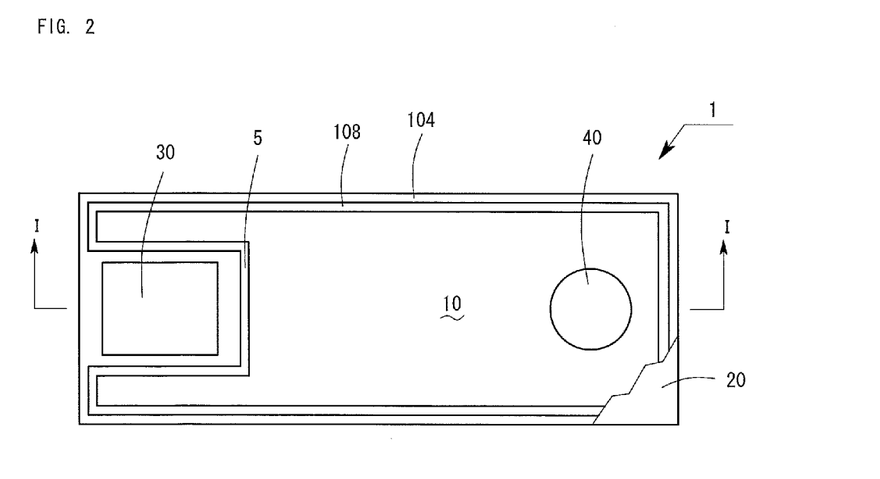
[FIG. 2] A plan view of a light-emitting device of the foregoing specific embodiment.

FIG. 1 is a cross-sectional view showing a semiconductor light-emitting device 1 of this Embodiment 1. FIG. 2 is a plan view thereof. A buffer layer 102 made of aluminum nitride (AlN) and having a film thickness of approximately 20 nm is formed on a sapphire substrate 101 having a thickness of 100 µm, and an n-type contact layer 104 (first semiconductor layer) that is a high carrier concentration n+ layer made of silicon (Si)-doped GaN and having a film thickness of approximately 8.0 µm is formed on the buffer layer 102. This n-type contact layer 104 has an electron density of $5 \times 10^{18}/cm^3$. Although it is preferable that the electron density of this layer is as high as possible, it is possible to increase the electron density to $2 \times 10^{19}/cm^3$. Then, on the n-type contact layer 104, a strain reducing layer 105 made of $In_{0.03}Ga_{0.97}N$ is formed so as to have a thickness of 200 nm. On the strain reducing layer 105, a light-emitting layer 106 having a multiple quantum well (MQW) structure in which three cycles of undoped GaN having a film thickness of 20 nm and undoped $Ga_{0.8}In_{0.2}N$ having a film thickness of 3 nm are deposited, is formed. A p-type layer 107 corresponding to a cladding layer made of magnesium (Mg)-doped $Al_{0.15}Ga_{0.85}N$ and having a film thickness of approximately 60 nm is formed on the light-emitting layer 106. Furthermore, a p-type contact layer 108 (second semiconductor layer) made of Mg-doped GaN and having a film thickness of approximately 130 nm is formed on the p-type layer 107.

Also, a transparent conductive film 10 made of ITO and formed by MOCVD is formed on the p-type contact layer 108. An exposed part 5 having a width of 3 µm is formed at an outer periphery of the upper surface of the p-type contact layer 108. Although it is preferable that the width of this exposed part 5 is as small as possible in view of light emission efficiency, the width is preferably 1 µm at minimum, considering short circuit at the pn junction on the sidewall of the step. When the width exceeds 6 µm, light emission efficiency is decreased. The width is preferably 6 µm or less. An insulating protective film 20 made of $SiO_2$ is formed on the transparent conductive film 10. A thickness of the transparent conductive film 10 is 0.5 µm, and a thickness of the insulating protective film 20 is 200 nm. A p-pad electrode 40 formed in a window opened through the insulating protective film 20, has a double structure of titanium (Ti) having a thickness of 0.01 µm and gold (Au) having a thickness of 0.5 µm. Also, the p-pad electrode 40 may be constituted of an alloy of Ti and Au.

Meanwhile, an n-electrode 30 is formed on the n-type contact layer 104 exposed upon being etched from the p-type contact layer 108. The n-electrode 30 has a double structure and is constituted by successively depositing a vanadium (V) layer 31 having a film thickness of approximately 18 nm, an aluminum (Al) layer 32 having a film thickness of approximately 1.8 µm on an electrode forming part 16 that is a partially exposed portion of the n-type contact layer 104.

Next will be described a method for producing the semiconductor light-emitting device according to this Embodiment. Firstly, the buffer layer 102 by low-temperature epitaxy of aluminum nitride (AlN) is formed on the sapphire substrate 101 at 400° C. by MOCVD. Subsequently, the n-type contact layer 104, the strain reducing layer 105, the light-emitting layer 106, the p-type layer 107, and the p-type contact layer 108, each of which is made of a Group III nitride semiconductor, are deposited in this order by MOCVD while adjusting the epitaxial growth temperature of each Group III nitride semiconductor to an optimal temperature. The raw material gases employed for MOCVD are as follows: ammonia ($NH_3$) as a nitrogen source, trimethylgallium ($Ga(CH_3)_3$) as a Ga source, trimethylindium ($In(CH_3)_3$) as an In source, trimethylaluminum ($Al(CH_3)_3$)) as an Al source, silane ($SiH_4$) as an n-type doping gas, cyclopentadienylmagnesium ($Mg(C_5H_5)_2$) as a p-type doping gas, and hydrogen ($H_2$) or nitrogen ($N_2$) as a carrier gas.

Figure 3:
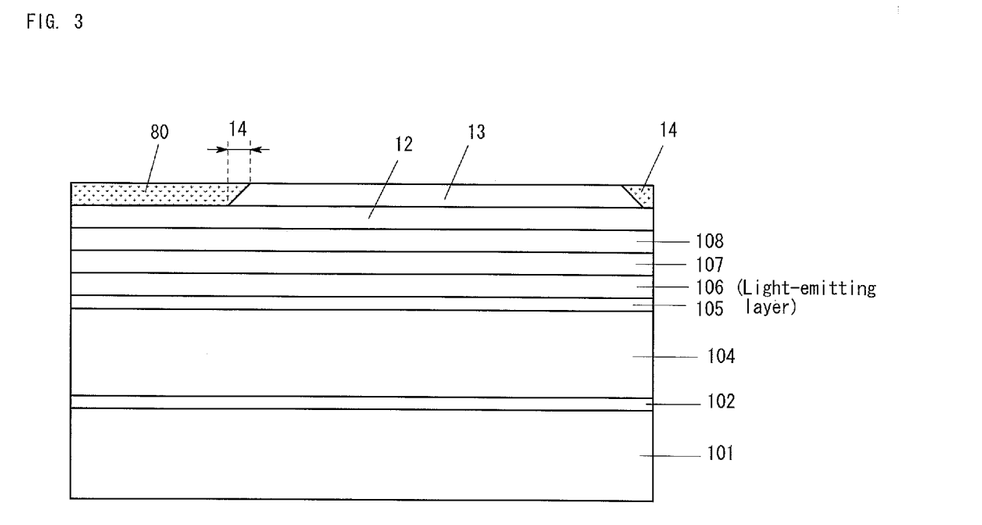
[FIG. 3] A cross-sectional view of a light-emitting device showing the production process of the light-emitting device of the foregoing specific embodiment.
Figure 4:
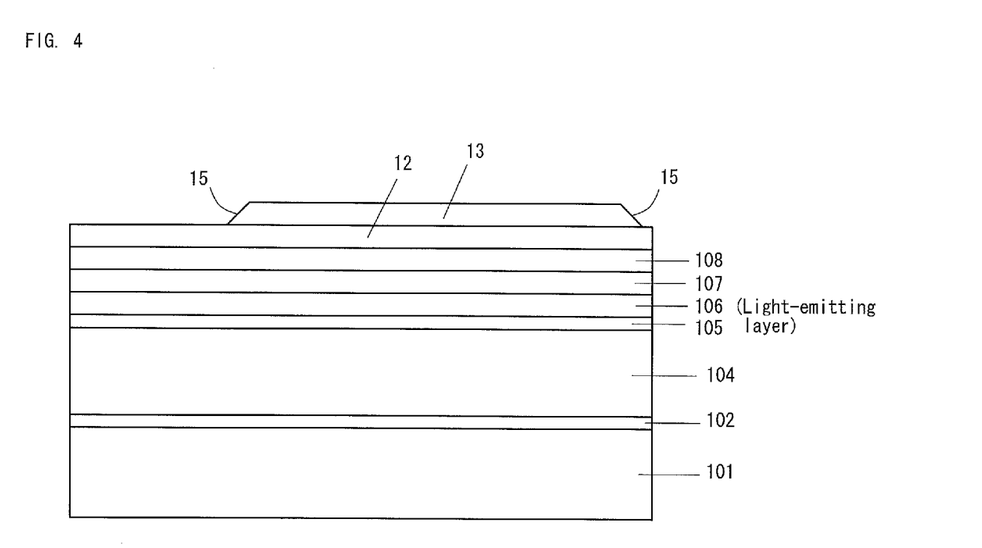
[FIG. 4] A cross-sectional view of a light-emitting device showing the production process of the light-emitting device of the foregoing specific embodiment.

The foregoing epitaxial growth of the semiconductor layer is a well known method. As shown in FIG. 3, ITO is evenly deposited in a thickness of 0.5 µm on the entire top surface of the p-type contact layer 108, thereby forming the transparent conductive film 12. Subsequently, a photo-resist 13 is applied in a thickness of 4 µm on the entire top surface of the transparent conductive film 12. Thereafter, the photo-resist 13 is exposed. At this time, as shown in FIG. 3, the photo-resist 13 is exposed so as to be inclined in a direction that the exposure intensity decreases toward the remaining portion of the photo-resist 13, at a boundary 14 of a portion where the photo-resist 13 is removed. For example, an inclination angle of the exposure intensity can be adjusted by changing a gap between a photo mask and a wafer (proximity gap) using the proximity exposure method or by changing the exposure intensity while keeping the proximity gap constant. Subsequently, the photo-resist 13 is developed to remove the exposed part 80, thereby forming the photo-resist 13 having an inclined portion 15 at the boundary 14 as shown in FIG. 4. The removed portion of the photo-resist 13 corresponds to the portion of the n-type contact layer 104 to be exposed.

Figure 5:
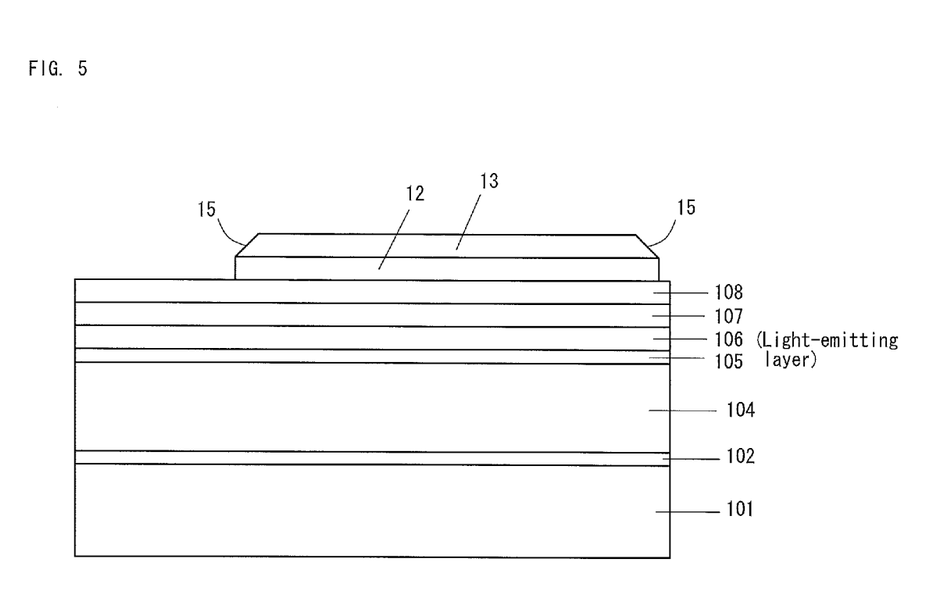
[FIG. 5] A cross-sectional view of a light-emitting device showing the production process of the light-emitting device of the foregoing specific embodiment.
Figure 6:
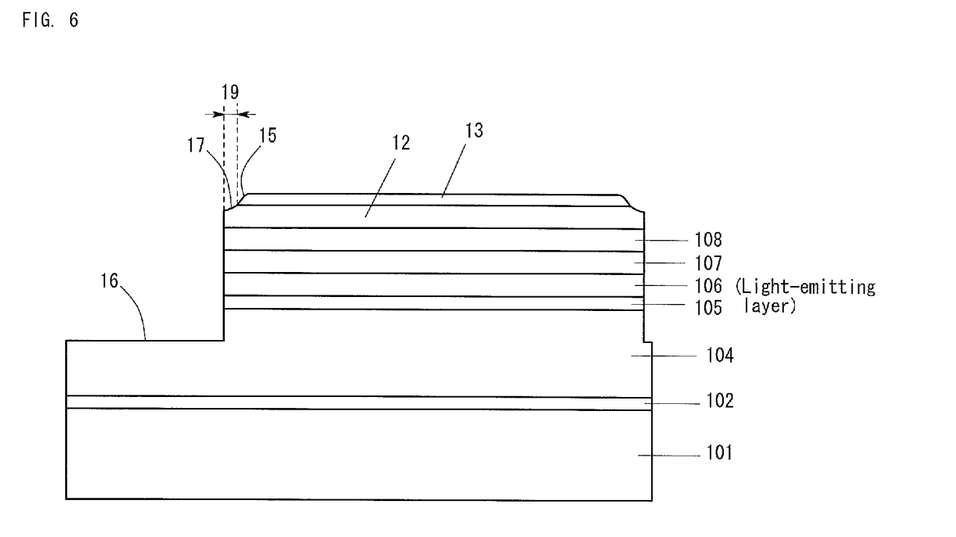
[FIG. 6] A cross-sectional view of a light-emitting device showing the production process of the light-emitting device of the foregoing specific embodiment.
Figure 7:
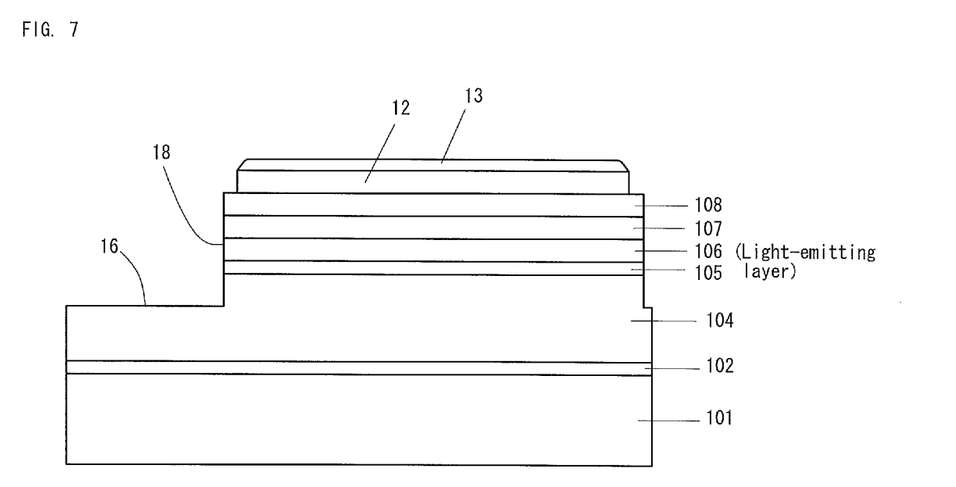
[FIG. 7] A cross-sectional view of a light-emitting device showing the production process of the light-emitting device of the foregoing specific embodiment.

Next, wet etching is performed in this state. As a result, the transparent conductive film 12 which is not covered by the photo-resist 13, is removed as shown in FIG. 5. Subsequently, dry etching is performed with chroline plasma while using a double layer of the remaining transparent conductive film 12 and the photo-resist 13 as a mask. As a result, as shown in FIG. 6, the n-type contact layer 104 is exposed, thereby forming an electrode forming part 16. At this time, since the photo-resist 13 is totally thinned and the inclined portion 15 is thin, a specified width portion 19 of the inclined portion 15 is removed by etching, and a part 17 of the transparent conductive film 12 as a lower layer is exposed. The transparent conductive film 12 under the part 19 is not completely removed at the time when etching is finished. The photo-resist 13 and the transparent conductive film 12 are designed to have the respective thickness that can achieve this state. Subsequently, as shown in FIG. 7, the exposed part 17 of the transparent conductive film 12 is wet etched using the remaining photo-resist 13 as a mask. The remaining part corresponds to the transparent conductive film 10 of the semiconductor light-emitting device 1 shown in FIG. 1. At this time, In, Sn or the like being a constituent element of ITO, which is adhered to the pn junction on the sidewall 18 of the step, is eliminated.

After this, a photo-resist is applied on the whole of the upper surface of this device, and a window of the photo-resist is formed in the p-pad electrode 40 forming part on the transparent conductive film 10 through exposure and development. Ti and Au are deposited in a thickness of 0.01 µm and 0.5 µm, respectively, and the photo-resist is lifted off, thereby forming the p-pad electrode 40. Similarly, a photo-resist is applied on the whole of the upper surface of this device, and a window of the photo-resist is formed in a portion corresponding to the electrode forming part 16 of the n-type contact layer 104 through exposure and development. V and Al are deposited in a thickness of 18 nm and 1.8 µm, respectively, thereby forming the n-electrode 30. Subsequently, $SiO_2$ is deposited in a thickness of 200 nm on the whole of the upper surface of this device, and a photo-resist is uniformly applied thereon. A window of the photo-resist is formed in a specified portion through exposure and development, and dry etching of $SiO_2$ is performed with fluorine-based etching gas. Thereafter the photo-resist is removed, thereby forming the insulating protective film 20.

Embodiment 2

Figure 8:
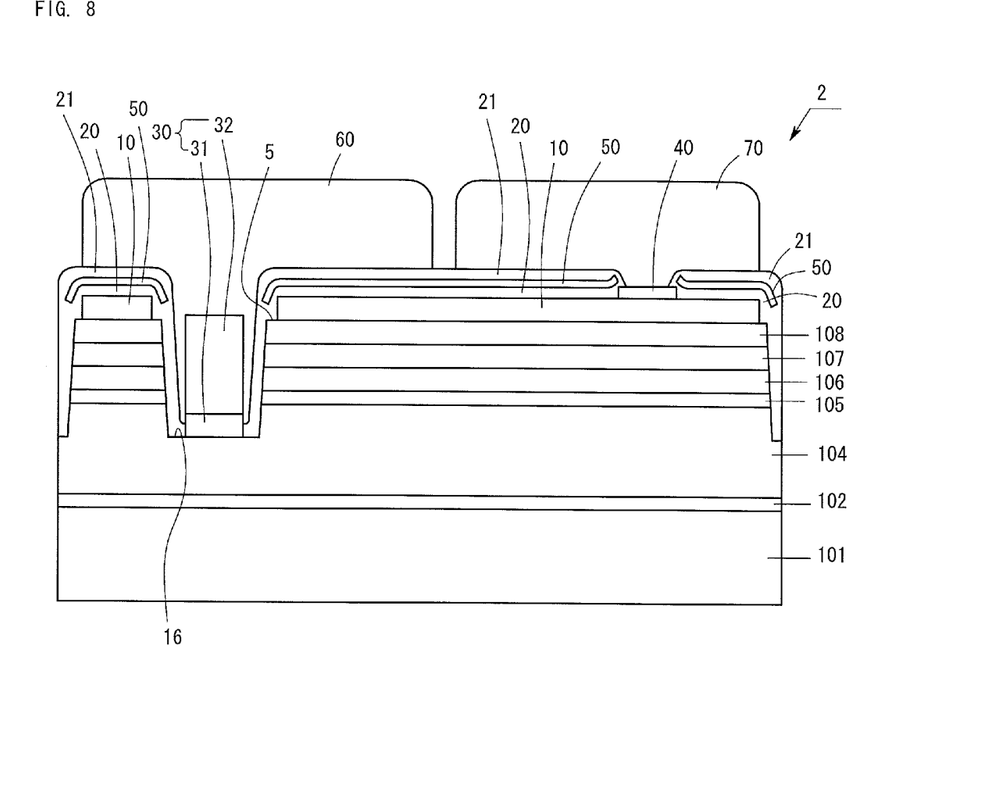
[FIG. 8] A cross-sectional view of a light-emitting device according to other embodiment of the present invention.

The present invention can also be employed when forming a flip-chip type semiconductor light-emitting device 2 as shown in FIG. 8. The same reference numerals are assigned to the same constituents as those in Embodiment 1. A first insulating protective film 20 made of $SiO_2$ is formed on a transparent conductive film 10, and a reflector 50 made of Al is formed on the first insulating protective film 20. A second insulating protective film 21 made of $SiO_2$ is formed on the reflector 50, the exposed first insulating protective film 20 and the upper surface of the device 2. In consequence, the reflector 50 exists in the insulating protective film having the first insulating protective film 20 and the second insulating protective film 21 integrated therein. Also, a p bump electrode 70 is connected to a p-pad electrode 40, and an n bump electrode 60 is connected to an n-electrode 30. In such a semiconductor light-emitting device 2, the method in Embodiment 1 can be used in dry etching when the electrode forming part 16 of the n-type contact layer 104 is exposed, an exposed part 5 having a micro width is formed at the edge of the step of the electrode forming part 16, thereby forming the transparent conductive film 10.

In all the foregoing embodiments, the semiconductor light-emitting device may have any layer configuration. The present invention can also be applied to any light-emitting device production method having the process of etching the semiconductor layer when a transparent conductive film is formed on a second semiconductor layer, an electrode is formed on a first semiconductor layer in the device having an n-electrode and a p-electrode on the same surface side.

Industrial Applicability

The present invention can be employed to improve the light emission efficiency of the semiconductor light-emitting device.

DESCRIPTION OF REFERENCE NUMERALS

1: Light-emitting device
5: Exposed part
10: Transparent conductive film
15: Inclined portion
20: Insulating protective film
40: p-pad electrode
101: Sapphire substrate
102: Buffer layer
104: n-type contact layer
105: Strain reducing layer
106: Light-emitting layer
107: p-type cladding layer
108: p-type contact layer
30: n-electrode

The invention claimed is:

1. A method for producing a semiconductor light-emitting device comprising a substrate; a first semiconductor layer with a first conduction type formed on the substrate; a second semiconductor layer with a second conduction type different from the first conduction type; a second electrode made of a transparent conductive film formed on the second semiconductor layer; and a first electrode formed on an electrode forming part of the first semiconductor layer, which is exposed by etching from the second semiconductor layer, the method comprising:
forming the transparent conductive film on an entire top surface of the second semiconductor layer;
applying a photo-resist on the transparent conductive film;
removing a portion, which exists right above the electrode forming part of the first semiconductor layer, of the photo-resist so that a remaining portion of the photo-resist is gradually thinned toward the portion to be removed at a boundary of the portion to be removed;
exposing a portion of the second semiconductor layer by wet etching the transparent conductive film using the remaining photo-resist;
exposing the electrode forming part of the first semiconductor layer by dry etching using the photo-resist and the transparent conductive film as a mask;
wet etching a portion, which is exposed in the dry etching, of the transparent conductive film using the remaining photo-resist as a mask; and
eliminating the remaining photo-resist.

2. The method for producing the semiconductor light-emitting device according to claim 1, wherein the thickness of the photo-resist at the boundary is adjusted by adjusting the exposure intensity distribution, thereby adjusting the photo-resist after development to be gradually thinned toward the portion to be removed.

3. The method for producing the semiconductor light-emitting device according to claim 2, wherein the exposure intensity distribution is made by a proximity exposure method.

4. The method for producing the semiconductor light-emitting device according to claim 1, wherein the first semiconductor layer is made of an n-type Group III nitride semiconductor, and the second semiconductor layer is made of a p-type Group III nitride semiconductor.

5. The method for producing the semiconductor light-emitting device according to claim 2, wherein the first semiconductor layer is made of an n-type Group III nitride semiconductor, and the second semiconductor layer is made of a p-type Group III nitride semiconductor.

6. The method for producing the semiconductor light-emitting device according to claim 3, wherein the first semiconductor layer is made of an n-type Group III nitride semiconductor, and the second semiconductor layer is made of a p-type Group III nitride semiconductor.

7. The method for producing the semiconductor light-emitting device according to claim 1, wherein a width of the portion of the transparent conductive film which is wet etched after exposing the electrode forming part of the first semiconductor layer by dry etching is 1 μm or more to 6 μm or less.

8. The method for producing the semiconductor light-emitting device according to claim 2, wherein a width of the portion of the transparent conductive film which is wet etched after exposing the electrode forming part of the first semiconductor layer by dry etching is 1 μm or more to 6 μm or less.

9. The method for producing the semiconductor light-emitting device according to claim 3, wherein a width of the portion of the transparent conductive film which is wet etched after exposing the electrode forming part of the first semiconductor layer by dry etching is 1 μm or more to 6 μm or less.

10. The method for producing the semiconductor light-emitting device according to claim 4, wherein a width of the portion of the transparent conductive film which is wet etched after exposing the electrode forming part of the first semiconductor layer by dry etching is 1 μm or more to 6 μm or less.

11. The method for producing the semiconductor light-emitting device according to claim 1, wherein the photo-resist, after removing the portion thereof, comprises an inclined portion which is gradually thinned toward the boundary.

12. The method for producing the semiconductor light-emitting device according to claim 11, wherein a tip of the inclined portion is removed in the dry etching for exposing the electrode forming part to expose the transparent conductive film under the tip.

13. The method for producing the semiconductor light-emitting device according to claim 12, wherein a width of a tip of the inclined portion which is removed is 1 μm or more to 6 μm or less.

14. The method for producing the semiconductor light-emitting device according to claim 1, wherein in the exposing the electrode forming part of the first semiconductor layer, a thickness of the photo-resist is uniformly thinned.

15. The method for producing the semiconductor light-emitting device according to claim 1, wherein in the wet etching the portion of the transparent conductive film, the transparent conductive film is wet etched such that a side surface of the transparent conductive film is perpendicular to a surface of the substrate.

16. The method for producing the semiconductor light-emitting device according to claim 11, further comprising:
after the exposing the electrode forming part, removing a width portion of the inclined portion by etching such that a part of the transparent conductive film is exposed.

17. The method for producing the semiconductor light-emitting device according to claim 16, wherein the exposed part of the transparent conductive film is defined by projecting the inclined portion of the photo-resist.

18. The method for producing the semiconductor light-emitting device according to claim 16, wherein the portion in the wet etching the portion of the transparent conductive film is the exposed part of the transparent conductive film.

19. The method for producing the semiconductor light-emitting device according to claim 16, wherein the exposed part of the transparent conductive film is gradually thinned in a tapered shape.

20. The method for producing the semiconductor light-emitting device according to claim 13, wherein a width of the portion of the transparent conductive film which is wet etched after exposing the electrode forming part of the first semiconductor layer by dry etching is 1 μm or more to 6 μm or less.

* * * * *